(12) United States Patent
Sugino et al.

(10) Patent No.: US 10,680,462 B2
(45) Date of Patent: Jun. 9, 2020

(54) HIGH FREQUENCY OSCILLATOR AND WIRELESS POWER SUPPLY DEVICE

(71) Applicants: DENSO CORPORATION, Kariya, Aichi-pref. (JP); National University Corporation Toyohashi University of Technology, Toyohashi-Shi, Aichi (JP)

(72) Inventors: Masayoshi Sugino, Kariya (JP); Takashi Ohira, Toyohashi (JP); Naoki Sakai, Toyohashi (JP); Satoshi Kitabayashi, Toyohashi (JP); Shinji Abe, Toyohashi (JP)

(73) Assignees: DENSO CORPORATION, Kariya, Aichi-pref. (JP); National University Corporation Toyohashi University of Technology, Toyohashi-Shi, Aichi (JP)

( * ) Notice: Subject to any disclaimer, the term of this patent is extended or adjusted under 35 U.S.C. 154(b) by 21 days.

(21) Appl. No.: 16/197,402

(22) Filed: Nov. 21, 2018

(65) Prior Publication Data

US 2019/0165607 A1    May 30, 2019

(30) Foreign Application Priority Data

Nov. 24, 2017  (JP) ................................. 2017-225916

(51) Int. Cl.
*H02J 50/05*        (2016.01)
*H03B 5/18*         (2006.01)
(Continued)

(52) U.S. Cl.
CPC ............... *H02J 50/05* (2016.02); *H01Q 1/00* (2013.01); *H03B 5/1817* (2013.01); *H03K 5/04* (2013.01);
(Continued)

(58) Field of Classification Search
CPC ......... H02J 50/05; H01Q 1/00; H03B 5/1817; H03K 5/04; H04B 1/0458; H04B 1/18; H03H 7/38
See application file for complete search history.

(56) References Cited

U.S. PATENT DOCUMENTS

2010/0031856 A1* 2/2010 Shoda ..................... B60L 5/005
                                                                108/21
2013/0127495 A1    5/2013 Miyazaki

FOREIGN PATENT DOCUMENTS

WO    WO-2012/070162 A1    5/2012

* cited by examiner

*Primary Examiner* — Carlos Amaya
(74) *Attorney, Agent, or Firm* — Harness, Dickey & Pierce, P.L.C.

(57) ABSTRACT

A high frequency oscillator has a high frequency generation part, an oscillation part, a matching unit, rectification element parts and switch parts. The oscillation part oscillates high frequency power generated by the high frequency generation part. The matching unit is arranged between the high frequency generation part and the oscillation part, and has one or more capacitors and matching circuits having difference characteristics so as to perform matching between the high frequency generation part and the oscillation part. The rectification element parts and the matching circuits are arranged in one-to-one correspondence. The rectification element parts rectify high frequency power supplied from the high frequency generation part to the oscillation part. The switch part is connected to the corresponding rectification element part to switch the corresponding capacitor connected to the corresponding matching circuit through the corresponding rectification element part.

9 Claims, 9 Drawing Sheets

(51) Int. Cl.
  *H01Q 1/00* (2006.01)
  *H01B 1/18* (2006.01)
  *H03K 5/04* (2006.01)
  *H04B 1/04* (2006.01)
  *H03H 7/38* (2006.01)
  *H04B 1/18* (2006.01)
(52) U.S. Cl.
  CPC ............ *H04B 1/0458* (2013.01); *H04B 1/18* (2013.01); *H03H 7/38* (2013.01)

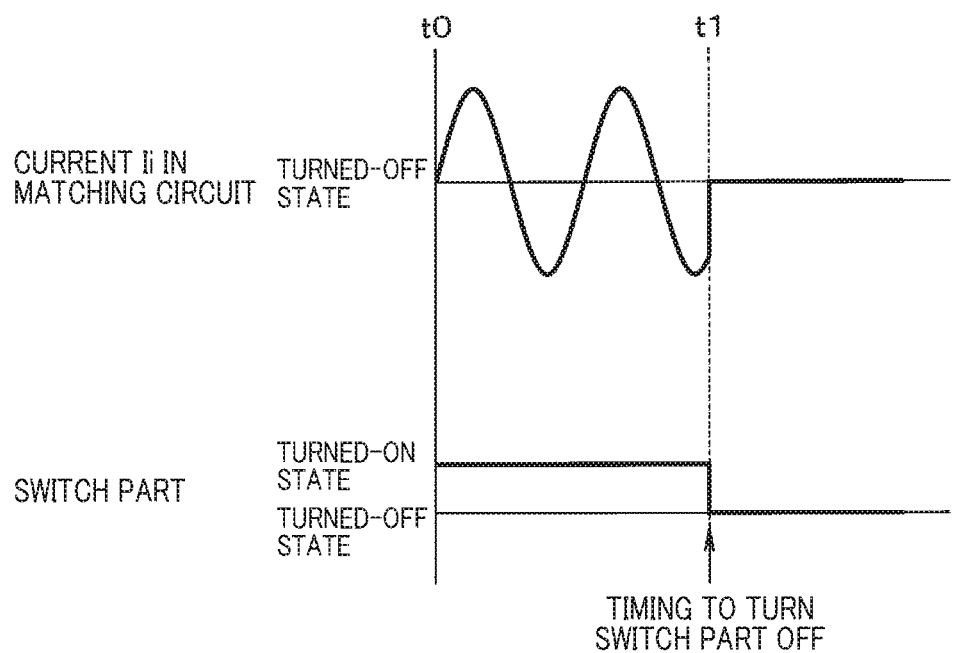

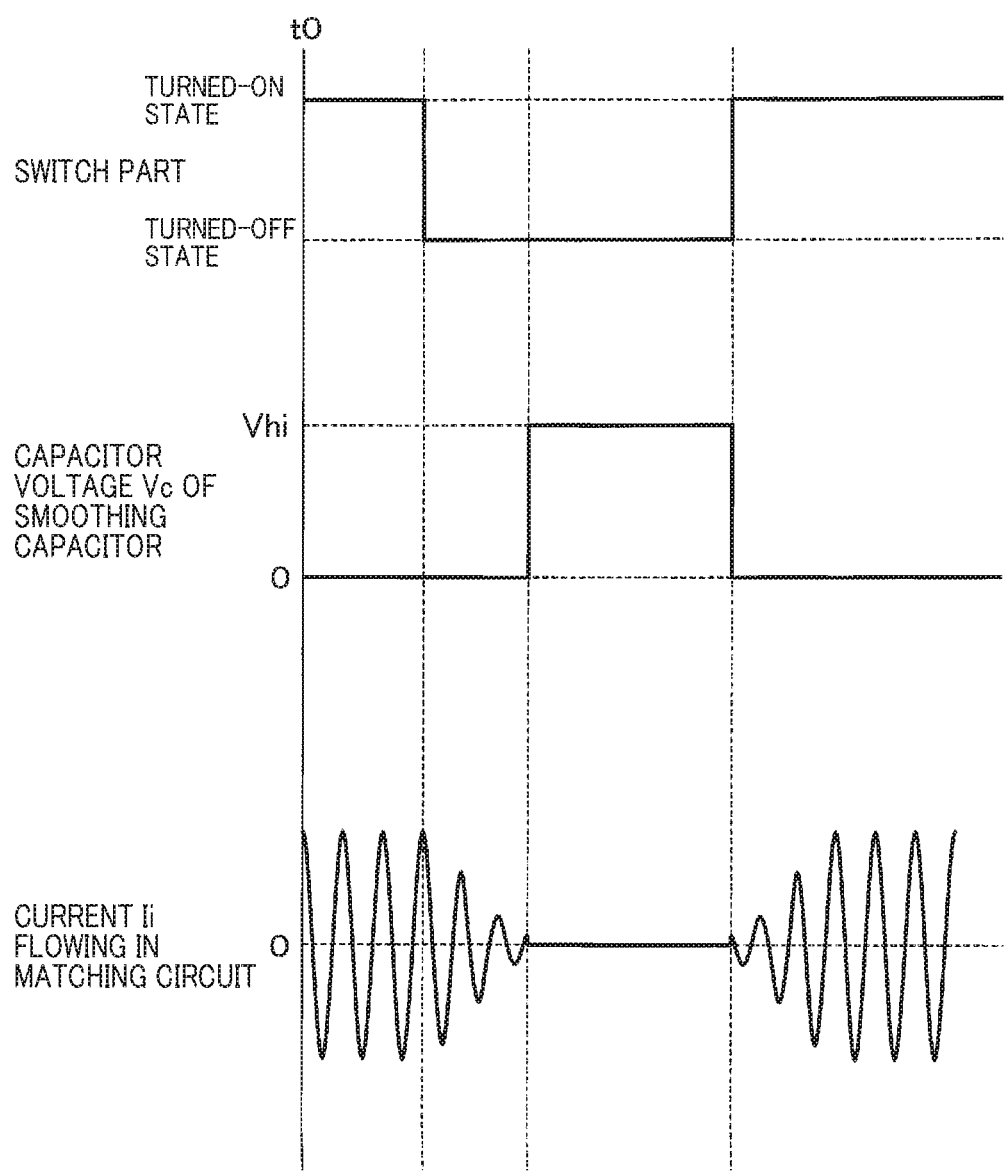

HIGH FREQUENCY OSCILLATOR AND WIRELESS POWER SUPPLY DEVICE

CROSS-REFERENCE TO RELATED APPLICATION

This application is related to and claims priority from Japanese Patent Application No. 2017-225916 filed on Nov. 24, 2017, the contents of which are hereby incorporated by reference.

BACKGROUND OF THE INVENTION

1. Field of the Invention

The present invention relates to high frequency oscillators and wireless power supply devices using the same.

2. Description of the Related Art

For example, a communication device uses a high frequency oscillator capable of generating high frequency power. That is, in the communication device, a high frequency generation part such as a class-E inverter generates high frequency power and supplies the generated high frequency power to an oscillation part such as an antenna. Such a high frequency oscillator having the structure previously described should match the high frequency generation part with the oscillation part so as to increase the operating efficiency of the communication device. In order to implement the request, a matching unit is arranged between the high frequency generation part and the oscillation part. In general, such a matching unit has a plurality of matching circuits having different characteristics. It is possible to match the high frequency generation part with the oscillation part by switching the plurality of matching circuits on the basis of the characteristics between the high frequency generation part and the oscillation part.

In general, a mechanical switch such as a relay is used for switching the matching circuits. The mechanical switch turns on/off the matching circuits so as to switch the matching circuits connected between the high frequency generation part and the oscillation part.

However, abrasion of a contact part and an operation part in such a mechanical switch occurs due to long use because of having a mechanical structure. In order to avoid this problem, a recent matching unit uses contactless switching elements composed of semiconductor devices. The use of such semiconductor devices as the contactless switching element often causes distortion of high frequency power and a power loss. In order to avoid this problem, it is necessary for the matching unit to use switching elements such as metal oxide semiconductor field effect transistors (MOS FETs) having a high operation frequency so as to perform the high frequency switching operation. For example, PCT International Publication No. WO 2012/070162 has disclosed such a related art.

SUMMARY

It is therefore desired to provide a high frequency oscillator and a wireless power supply device using the high frequency oscillator. The high frequency oscillator uses a direct current or a frequency, which is lower than a frequency of high frequency power generated by a high frequency generation part, so as to switch characteristics of matching circuits with high efficiency.

In accordance with a preferred embodiment of the present invention, there is provides a high frequency oscillator has a high frequency generation part, an oscillation part and a matching unit. The high frequency generation part generates high frequency power. The oscillation part oscillates the high frequency power generated by the high frequency generation part. The matching unit is arranged between the high frequency generation part and the oscillation part to match the high frequency generation part with the oscillation part. The matching unit has one or more matching circuits having different characteristics, one or more rectification element parts and switch parts. The matching circuits correspond to the respective rectification element parts and switch parts in one to one correspondence. Each of the matching to circuits has a capacitor. The rectification element parts rectify the high frequency power supplied from the high frequency generation part to the oscillation part. The switch parts are connected to the respective rectification element parts and each of the switching parts switches a state of the corresponding capacitor connected to the corresponding rectification element part.

In the improved structure of the high frequency oscillator previously described, each switch part switches characteristics of the corresponding matching circuit in the matching unit through the corresponding rectification element part. Each matching circuit is connected to the corresponding rectification element part. The rectification element parts rectify high frequency power supplied from the high frequency generation part to the oscillation part. Each switch part switches the state of the corresponding matching circuit through the corresponding rectification element part. That is, each switch part allows the current rectified by the corresponding rectification element part to flow, and prohibits this current from flowing. When the switch part prohibits the flow of the current rectified by the corresponding rectification element part, the current of the high frequency power is prohibited from flowing in the rectification element part connected to this switch part. That is, the switch part prohibits the current from flowing in the corresponding matching circuit including the capacitor regardless of a magnitude of the frequency of the high frequency power. It is sufficient for each switch part to only allow or prohibit the flow of a direct current rectified by the corresponding rectification element par. This makes it possible for the high frequency oscillator to switch the state of the matching circuits in the matching unit on the basis of a direct current or a frequency which is lower than the frequency of the high frequency power generated by the high frequency generation part. This improved structure and operation make it possible to allow use of switch parts having low performance with low cost.

BRIEF DESCRIPTION OF THE DRAWINGS

A preferred, non-limiting embodiment of the present invention will be described by way of example with reference to the accompanying drawings, in which:

FIG. 3 is a view schematically showing a turned-on state and a turned-off state of a switch part and a current flowing in the matching circuit in the high frequency oscillator according to the exemplary embodiment of the present invention shown in FIG. 1;

FIG. 5 is a view showing a relationship between the turned-on state and the turned-off state of the switch part, a capacitor voltage of a smoothing capacitor in the rectification element part and the current flowing in the matching circuit in the matching unit of the high frequency oscillator according to the exemplary embodiment of the present invention shown in FIG. 1;

DETAILED DESCRIPTION OF THE PREFERRED EMBODIMENTS

Figure 1:
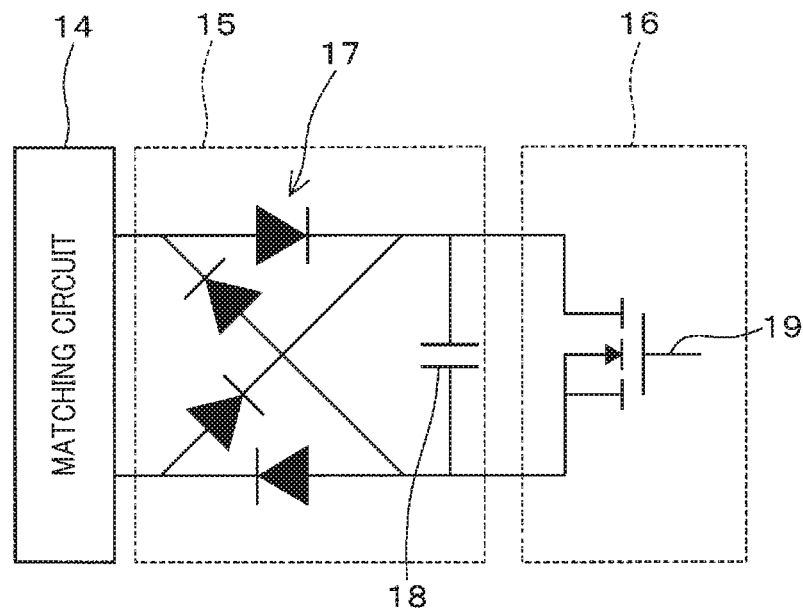
FIG. 1 is a view showing a structure of each of rectification element parts and each of switch parts, and further showing a connection structure between a matching circuit, the rectification element part and the switch part in a high frequency oscillator according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a high frequency oscillator 10 and a wireless power supply device 30 according to an exemplary embodiment of the present invention with reference to FIG. 1 to FIG. 12.

Figure 2:
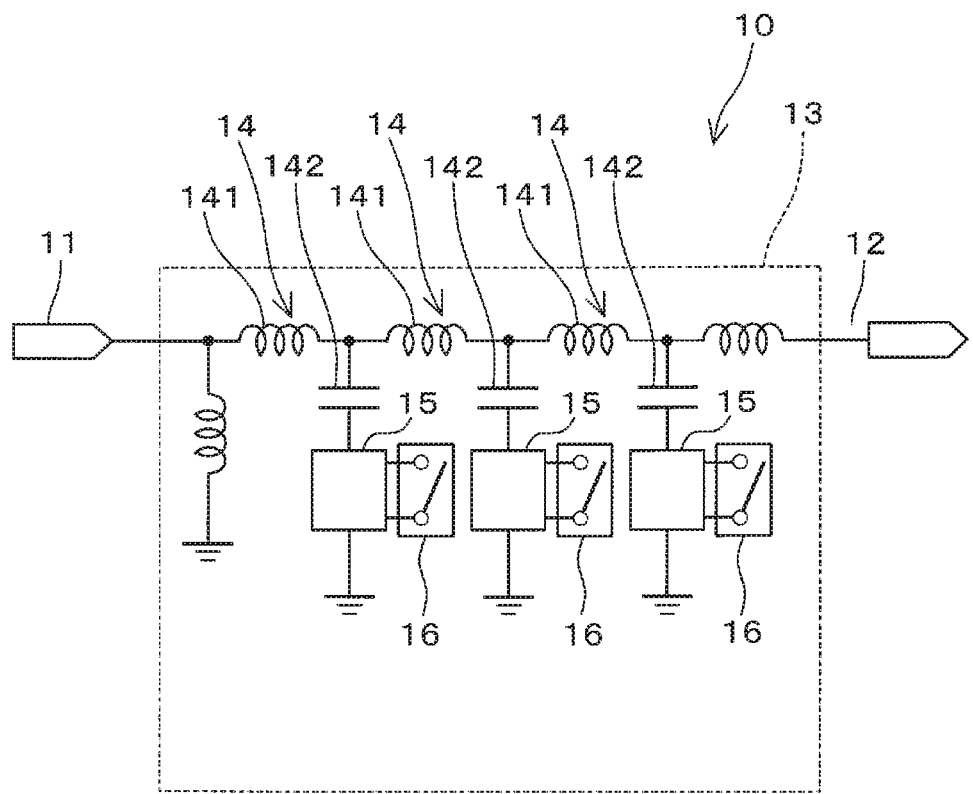
FIG. 2 is a view schematically showing an electrical structure of the high frequency oscillator according to the exemplary embodiment of the present invention shown in FIG. 1.

FIG. 2 is a view schematically showing an electrical structure of the high frequency oscillator 10 according to the exemplary embodiment of the present invention. As shown in FIG. 2, the high frequency oscillator 10 has a high frequency generation part 11, an oscillation part 12 and a matching unit 13.

For example, the high frequency generation part 11 is composed of a class E inverter capable of generating high frequency power. The high frequency generation part 11 transmits the generated high frequency power to the oscillation part 12.

The high frequency generation part 11 is composed of an oscillation element such as a crystal oscillator and semiconductor switching elements. It is acceptable to use another device capable of generating high frequency power instead of using such a class E inverter.

For example, the oscillation part 12 is composed of an antenna. When receiving the high frequency power, the oscillation part 12 oscillates the high frequency power.

As shown in FIG. 2, the matching unit 13 is arranged between the high frequency generation part 11 and the oscillation part 12. The matching unit 13 is composed of one or more matching circuits 14.

In the structure shown in FIG. 2, each of the matching circuits 14 is a LC circuit having a specific impedance which is composed of a coil 141 and a capacitor 142. The number of the matching circuits 14 in the matching unit 13 is determined by characteristics which vary on the basis of the high frequency generation part 11 and the oscillation part 12. For example, the matching unit 13 in the high frequency oscillator 10 shown in FIG. 2 has the three matching circuits 14.

In the structure of the high frequency oscillator 10 shown in FIG. 2, the matching unit 13 has the matching circuits 14, rectification element parts 15 and switch parts 16. Each of the rectification element parts 15 is connected to the corresponding matching circuit 14. Each of the switch parts 16 is connected to the corresponding rectification element part 15.

FIG. 1 is a view showing a structure of each of the rectification element parts 15 and each of the switch parts 16. FIG. 1 further shows a connection between the matching circuit 14, the rectification element part 15 and the switch part 16 in the high frequency oscillator 10 according to an exemplary embodiment of the present invention.

As shown in FIG. 1, the rectification element part 15 is connected to the respective corresponding matching circuit 14 and the respective switch part 16. For example, the rectification element part 15 is composed of a diode bridge 17 and a smoothing capacitor 18. The diode bridge 17 is composed of four diodes. As shown in FIG. 2, the rectification element part 15 rectifies the high frequency power which is supplied from the high frequency generation part 11 to the oscillation part 12.

The switch part 16 is connected to the corresponding rectification element part 15 so as to switch the corresponding matching circuit 14. As shown in FIG. 1 and FIG. 2, the rectification element part 15 is arranged between the corresponding matching circuit 14 and the corresponding switch part 16.

For example, the switch part 16 is composed of one of a non-contact type direct current (DC) switch, a transistor, a triac, a diode, a metal oxide semiconductor field effect transistor (MOS FET) having a low drive frequency and an insulated gate bipolar transistor (IGBT) having a low drive frequency. That is, the drive frequency of the switch part 16 is adequately lower than a high frequency of the high frequency power supplied from the high frequency generation part 11 to the oscillation part 12.

The switch part 16 is turned on/off on the basis of a control signal to be supplied to a gate terminal 19 (see FIG. 1) of the switch part 16 so as to switch the corresponding capacitor 142.

FIG. 3 is a view schematically showing a turned-on state and a turned-off state of the switch part 16 and a current flowing in the matching circuit 14 in the high frequency oscillator 10 according to the exemplary embodiment of the present invention shown in FIG. 1.

As shown in FIG. 3, the switch part 16 is turned on during a period counted from timing t0 to timing t1 so as to allow the power supply to the capacitor 142. At timing t1 shown in FIG. 3, the switch part 16 is turned off to prohibit the power supply to the capacitor 142.

A description will now be given of behavior of the matching circuits 14 on the basis of the operation of the corresponding rectification element part 15 and the corresponding switch part 16 with reference to FIG. 4A and FIG. 4B.

Figure 4A:
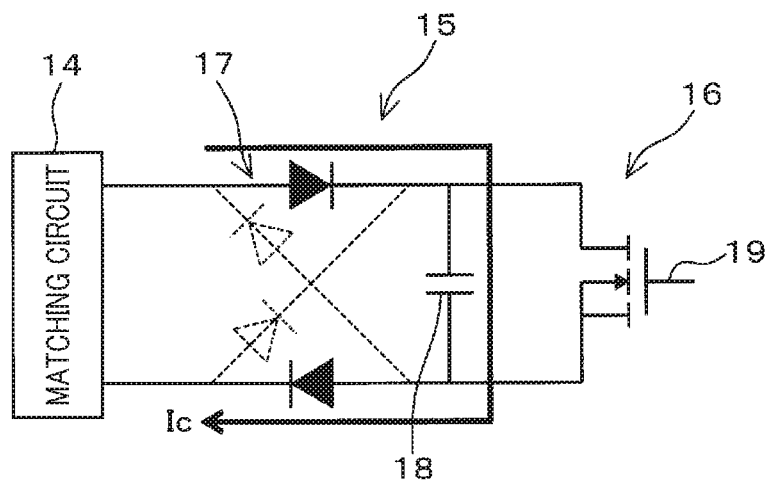
FIG. 4A and FIG. 4B are views showing a current flowing in the rectification element part in the matching unit during the turned-on state of the switch part in the high frequency oscillator according to the exemplary embodiment of the present invention shown in FIG. 1.
Figure 4B:
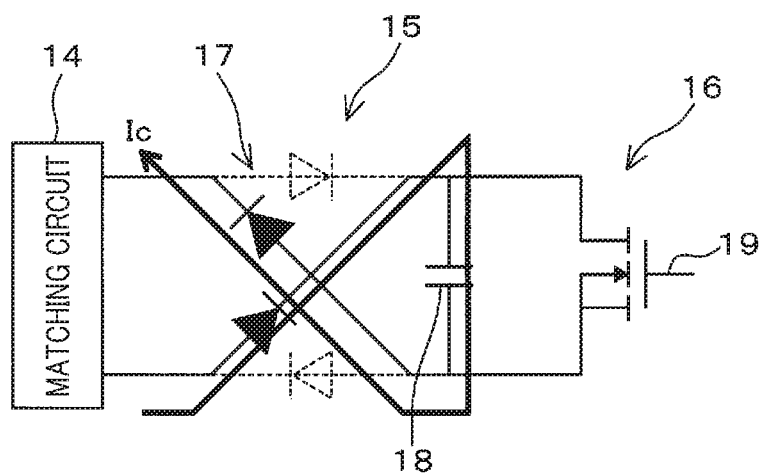

FIG. 4A and FIG. 4B are views showing a current flowing in the rectification element part 15 in the matching unit 13 during the turned-on state of the switch part 16 in the high frequency oscillator 10 according to the exemplary embodiment of the present invention shown in FIG. 1.

Because the rectification element part 15 is connected to the corresponding matching circuit 14, this matching circuit 14 receives the high frequency power supplied from the high frequency generation part 11 to the oscillation part 12. When the rectification element part 15 receives the high frequency power, a current flows in the smoothing capacitor 18 in the rectification element part 15. As shown in FIG. 4A and FIG. 4B, the rectification element part 15 rectifies the high frequency power. Accordingly, no high frequency power is supplied to the switch part 16. That is, the current flowing in the switch part 16 is a direct current and a voltage supplied to the switch part 16 is a direct current (DC) voltage.

During the turned-on state of the switch part 16, a capacitor voltage Vc between both terminals of the smoothing capacitor 18 becomes zero (0 V) even if receiving a direct current or the high frequency power. As shown in FIG. 4A, a forward current flows in the rectification element part 15 during a positive cycle of the high frequency power. On the other hand, as shown in FIG. 4B, a reverse current flows in the rectification element part 15 during a negative cycle of the high frequency power.

In both the examples shown in FIG. 4A and FIG. 4B, when the switch part 16 is turned on, the capacitor voltage Vc of the smoothing capacitor 18 becomes zero (0 V). Accordingly, when receiving the high frequency power, the smoothing capacitor 18 makes a short circuit.

As designated by the arrow Ic shown in FIG. 4A and FIG. 4B, the current flowing in the rectification element part 15 through the smoothing capacitor 18, and does not flow in the switch part 16.

FIG. 5 is a view showing a relationship between the turned-on state and the turned-off state of the switch part 16, the capacitor voltage Vc of the smoothing capacitor 18 in the rectification element part 15 and the current Ii flowing in the matching circuit 14 in the matching unit 13 of the high frequency oscillator 10 according to the exemplary embodiment of the present invention shown in FIG. 1.

As previously described, during the turned-on state of the switch part 16, the current Ii flows in the matching circuits 14 connected to the corresponding rectification element part 15 on the basis of the received high frequency power. That is, the matching circuit 14 enters the turned-on state.

On the other hand, when the switch part 16 is turned off, the smoothing capacitor 18 is charged. In this case, the capacitor voltage Vc of the smoothing capacitor 18 increases to a voltage $V_{hi}$ which corresponds to the amplitude of the high frequency power. When the capacitor voltage Vc of the smoothing capacitor 18 increases, the voltage becomes a reverse voltage or zero, and as a result, the rectification element part 15 enters in an open state. That is, when the switch part 16 is turned off, the matching circuit 14 connected to the corresponding rectification element part 15 prohibits the current Ii from flowing in the matching circuit 14. It is accordingly possible to switch the characteristics of the matching circuits 14 connected to the corresponding matching circuits 14 by switching the capacitors 142 in the matching unit 13.

As previously described and shown in FIG. 3 and FIG. 5, the matching circuits 14 are turned on and off on the basis of the turned-on state and the turned-off state of the corresponding switch parts 16. Each of the switch parts 16 allows the current rectified by the corresponding rectification element part 15 to flow or prohibits the current from flowing. It is accordingly possible to use, as the switch part 16, one of a non-contact DC switch, a transistor and a MOS FET and an IGBT operating at a low frequency.

The concept of the present invention is not limited by the high frequency oscillator 10 according to the exemplary embodiment previously described.

FIG. 6A to FIG. 6F are views schematically showing six modifications of the rectification element part 15 in the matching unit 13 of the high frequency oscillator according to the exemplary embodiment of the present invention shown in FIG. 1.

Figure 6A:
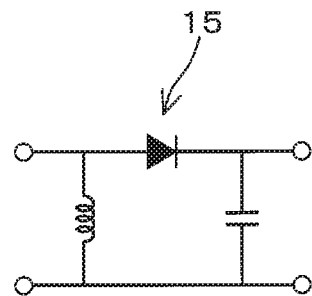
FIG. 6A to FIG. 6F are views schematically showing six modifications of the rectification element part in the matching unit of the high frequency oscillator according to the exemplary embodiment of the present invention shown in FIG. 1.
Figure 6B:
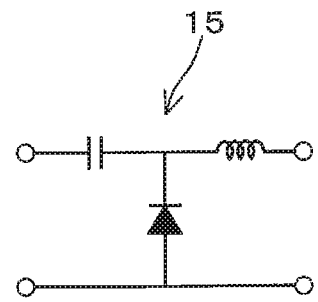
Figure 6C:
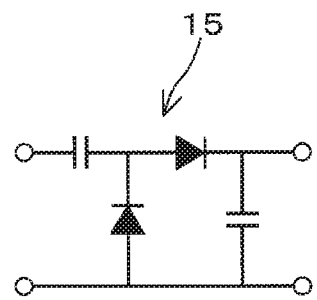
Figure 6D:
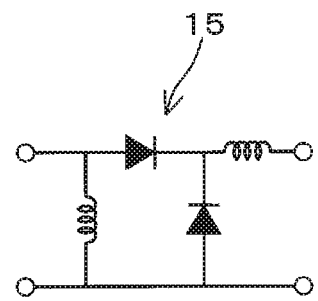
Figure 6E:
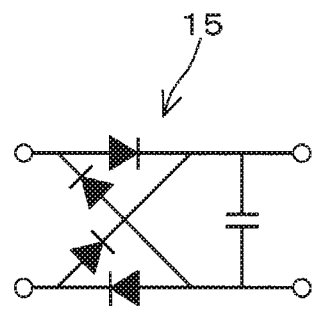
Figure 6F:
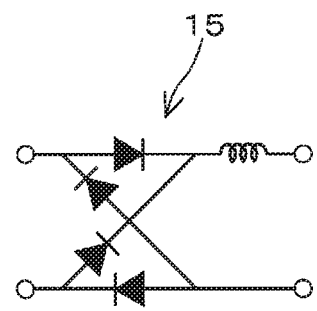

It is acceptable for each of the rectification element parts 15 to have one of a structure using a single series circuit shown in FIG. 6A, a structure using a single shunt circuit shown in FIG. 6B, a structure using a double voltage circuit shown in FIG. 6C, a structure using a double current circuit shown in FIG. 6D, a structure using a bridge C circuit shown in FIG. 6E, a structure using a bridge L circuit shown in FIG. 6F.

Figure 7:
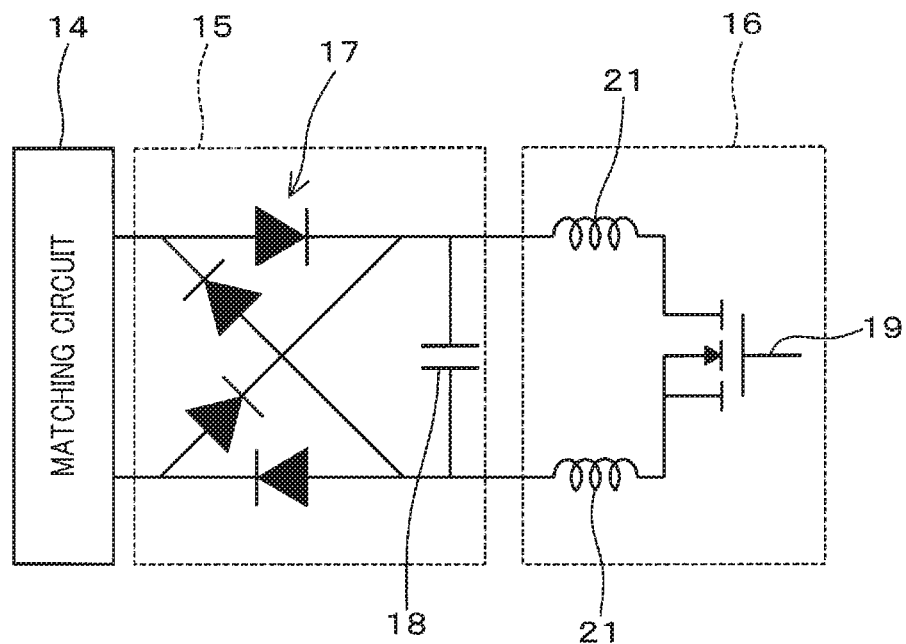
FIG. 7 is a view schematically showing a modification of a circuit structure of the switch part in the matching unit of the high frequency oscillator according to the exemplary embodiment of the present invention shown in FIG. 1.

FIG. 7 is a view schematically showing a modification of a circuit structure of the switch part 16 in the matching unit 13 of the high frequency oscillator according to the exemplary embodiment of the present invention shown in FIG. 1.

When the rectification element part 15 has a low smoothing function, it is acceptable to add coil elements 21 into the switch part 16 shown in FIG. 7.

A description will now be given of the wireless power supply device 30 according to the exemplary embodiment of the present invention with reference to FIG. 8 to FIG. 10.

Figure 8:
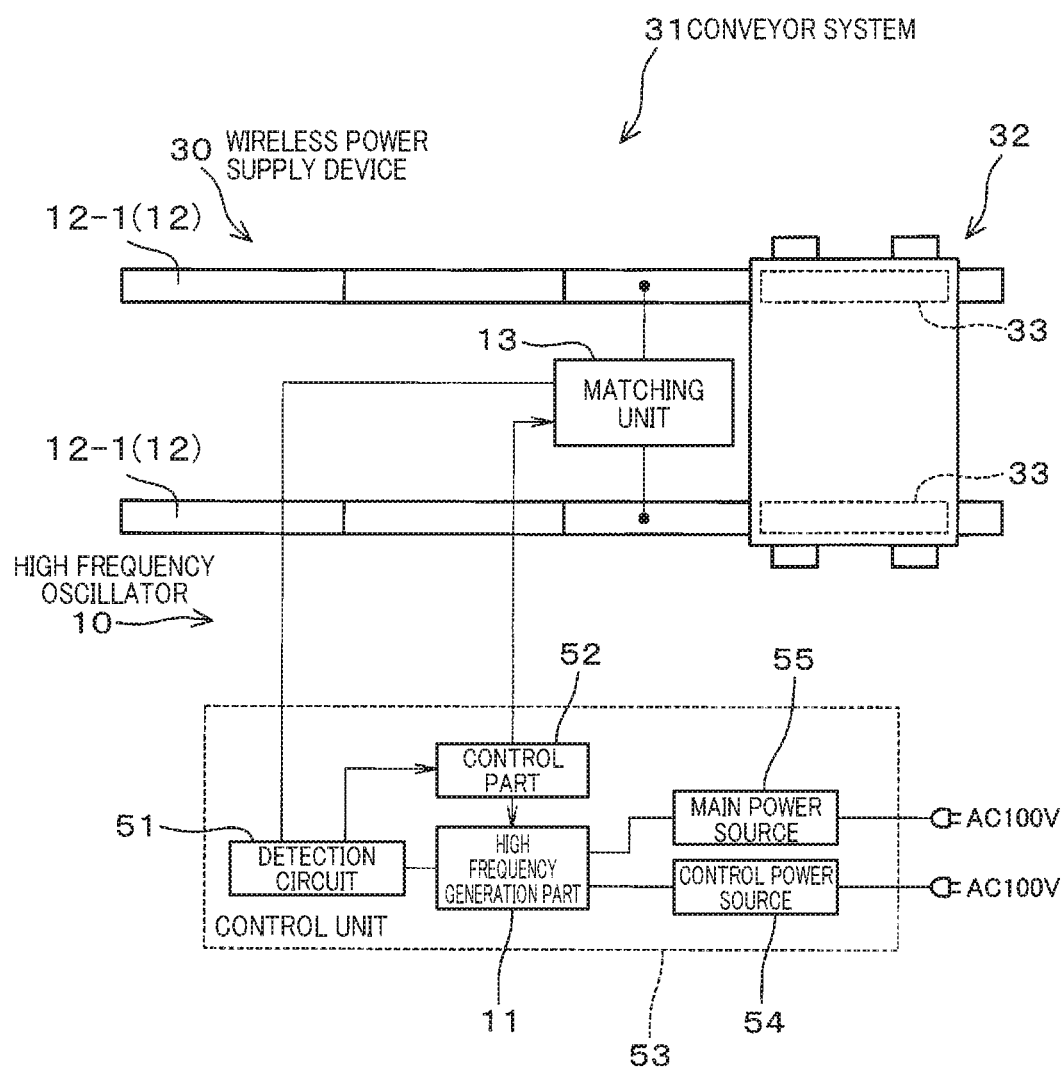
FIG. 8 is a view showing a schematic structure of a wireless power supply device using the high frequency oscillator according to the exemplary embodiment of the present invention shown in FIG. 1.

FIG. 8 is a view showing a schematic structure of the wireless power supply device 30 using the high frequency oscillator 10 according to the exemplary embodiment of the present invention shown in FIG. 1.

As shown in FIG. 8, the high frequency oscillator 10 is applied to the wireless power supply device 30.

Figure 9:
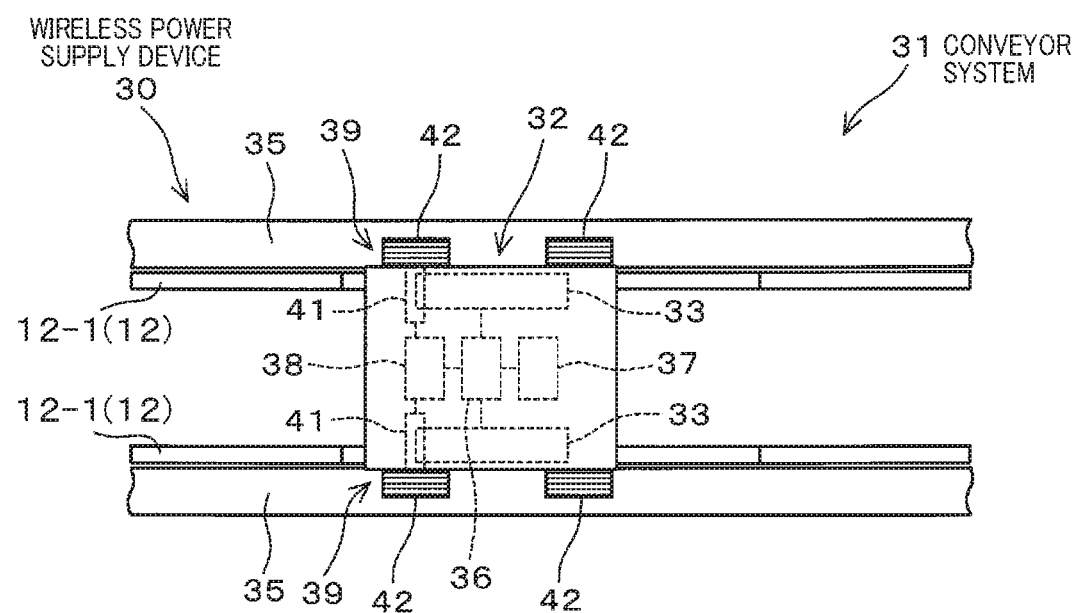
FIG. 9 is a top view showing a schematic structure of a conveyor system using the wireless power supply device equipped with the high frequency oscillator according to the exemplary embodiment of the present invention shown in FIG. 1.

FIG. 9 is a top view showing a schematic structure of a conveyor system 31 using the wireless power supply device 30 equipped with the high frequency oscillator 10 according to the exemplary embodiment of the present invention shown in FIG. 1. FIG. 10 is a side view showing the schematic structure of the conveyor system 31 using the wireless power supply device 30 equipped with the high frequency oscillator 10 according to the exemplary embodiment of the present invention shown in FIG. 1.

Figure 10:
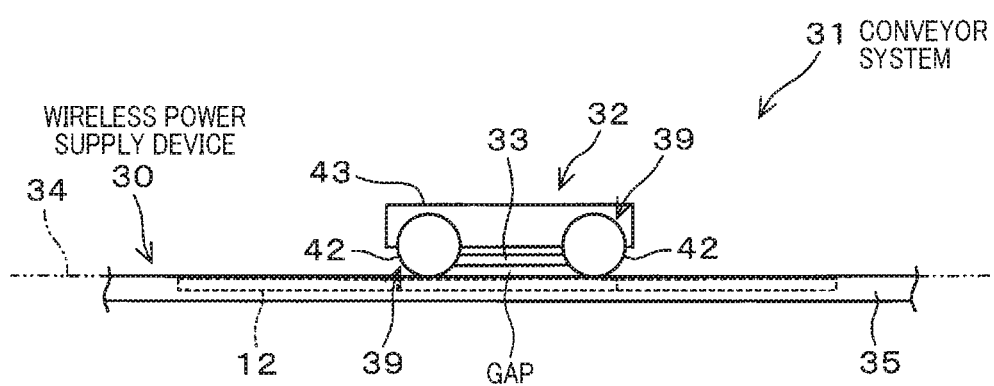
FIG. 10 is a side view showing the schematic structure of the conveyor system using the wireless power supply device equipped with the high frequency oscillator according to the exemplary embodiment of the present invention shown in FIG. 1.

As shown in FIG. 8 to FIG. 10, the conveyor system 31 has the wireless power supply device 30 and a moving body 32. The wireless power supply device 30 has a power supply electrode member as the oscillation part 12 and pair of power receiving electrode members 33. The power supply electrode member as the oscillation part 12 has a pair of rails 12-1.

The power supply electrode member as the oscillation part 12 is mounted in facilities 34 such as factories and warehouses which use the conveyor system 31.

The moving body 32 moves along travelling lanes 35 in the facility 34. As shown in FIG. 9, the moving body 32 has a rectification circuit part 36, a battery 37, a control part 38 and a drive part 39.

The rectification circuit part 36 rectifies a high frequency power received by the power receiving electrode members 33 to generate a direct current. The battery 37 is composed of a lithium ion rechargeable battery, for example. The battery 37 stores, i.e. charges the electric power rectified by the rectification circuit part 36. The control part 38 adjusts the charging of the power to the battery 37. The control part 38 further adjusts the drive power generated by the drive part 39. The drive part 39 has a motor 41 and wheels 42. The wheels 42 of the moving body 32 move along the travelling lanes 35 by the drive power generated by the drive part 39. As shown in FIG. 10, the moving body 32 has a cargo bed 43 to load a cargo. The cargo bed 43 is arranged at the location which is opposite from the location of the power supply electrode member as the oscillation part 12.

In the conveyor system 31 according to the exemplary embodiment, the power supply electrode member as the oscillation part 12 capable of supplying electric power is arranged in a side part on the travelling lanes 35 on which the moving body 32 is moving. When the moving body 31 faces the power supply electrode member as the oscillation part 12 mounted on the travelling lanes 35 during the movement along the travelling lanes 35, the moving body 32 receives electric power from power supply electrode member as the oscillation part 12. The received electric power is used as the drive power of the motor 41 and the wheels 42.

The rectification circuit part 36 in the moving body 32 rectifies the electric power received by the pair of power receiving electrode members 33. The battery 37 in the moving body 32 stores the rectified electric power. As shown in FIG. 10, the total length of the power supply electrode member as the oscillation part 12 is longer than the length of the moving body 32. The extension of the length of power supply electrode member as the oscillation part 12 rather than the length of the moving body 32 makes it possible for two or more moving bodies 32 to simultaneously receive the electric power from the power supply electrode member as the oscillation part 12.

The power supply electrode member as the oscillation part 12 is composed of the pair of rails 12-1 having a straight shape which are arranged in parallel to each other. As shown in FIG. 9, the power supply electrode member having the pair of rails 12-1 is arranged on the wireless power supply device 30.

It is acceptable for the rails forming the power supply electrode member as the oscillation part 12 to have a curved shape or a bent shape instead of a straight shape according to the structure of the facility 34. For example, the power supply electrode member having the pair of rails 12-1 has a plate shape and is made of aluminum or iron member.

The pair of power receiving electrode members 33 forming the wireless power supply device 30 are mounted on the moving body 32. Similar to the power supply electrode member as the oscillation part 12, the power receiving electrode members 33 are made of aluminum or iron members. The moving body 32 has the pair of power receiving electrode members 33 corresponding to the pair of rails 12-1 in the power supply electrode member as the oscillation part 12. As shown in FIG. 9, the pair of power receiving electrode members 33 and the pair of rails 12-1 in the power supply electrode member are arranged without contact, and facing each other.

As previously described, a gap is formed between the pair of rails 12-1 in the power supply electrode member as the oscillation part 12 and the pair of power receiving electrode members 33, and the gap is filled with air as a dielectric. Accordingly, the gap between the pair of rails 12-1 in the power supply electrode member and the pair of power receiving electrode members 33 is filled with air having a specific electrostatic capacitance. The wireless power supply is performed from the power supply electrode member as the oscillation part 12 to the power receiving electrode members 33 on the basis of electric field coupling.

As shown in FIG. 8, the wireless power supply device 30 further has a control unit 53 in addition to the high frequency oscillator 10, the power supply electrode member as the oscillation part 12 and the pair of power receiving electrode members 33. The control unit 53 has a detection circuit 51 and a control part 52.

As shown in FIG. 8, it is acceptable to separate the high frequency generation part 11 from the high frequency oscillator 10, and to assemble, into the control unit 53, the high frequency generation part 11, the detection circuit 51 and the control part 52 together.

The behavior of the high frequency generation part 11 in the high frequency oscillator 10 is controlled on the basis of electric power supplied from a control power source 54, and uses the electric power supplied from a main power source 55 to generate high frequency power.

As previously described, the matching unit 13 in the high frequency oscillator 10 has a plurality of the matching circuits 14.

As shown in FIG. 9, when the high frequency oscillator 10 is used as wireless power supply in the conveyor system 31, each of the matching circuits 14 is a LC circuit having a specific impedance composed of the coil 141 and the capacitor 142.

When the high frequency oscillator 10 is used as wireless power supply in the conveyor system 31, the number of the matching circuits 14 is determined on the basis of the number of the moving bodies 32 which receive high frequency power through the power supply electrode member as the oscillation part 12 composed of the pair of rails 12-1.

The matching unit 13 shown in FIG. 2 has the four matching circuits 14 which correspond to the four moving bodies 32.

For example, when only one moving body 32 moves on the rails 12-1 of the power supply electrode member, i.e., when one moving body faces the power supply electrode member as the oscillation part 12, all matching circuits are turned off. When the number of the moving bodies 32 becomes not less than two or more, the control part 52 in the control unit 53 adjusts, i.e. changes, the number of the turned-on matching circuits 14 in the matching unit 13. As previously described, the control part 52 in the control unit 53 generates control signals and transmits the control signals to the matching unit 13 so as to turn on/off the matching circuits 14 on the basis of the number of the moving bodies 31 which currently face the power supply electrode member as the oscillation part 12.

Figure 11:
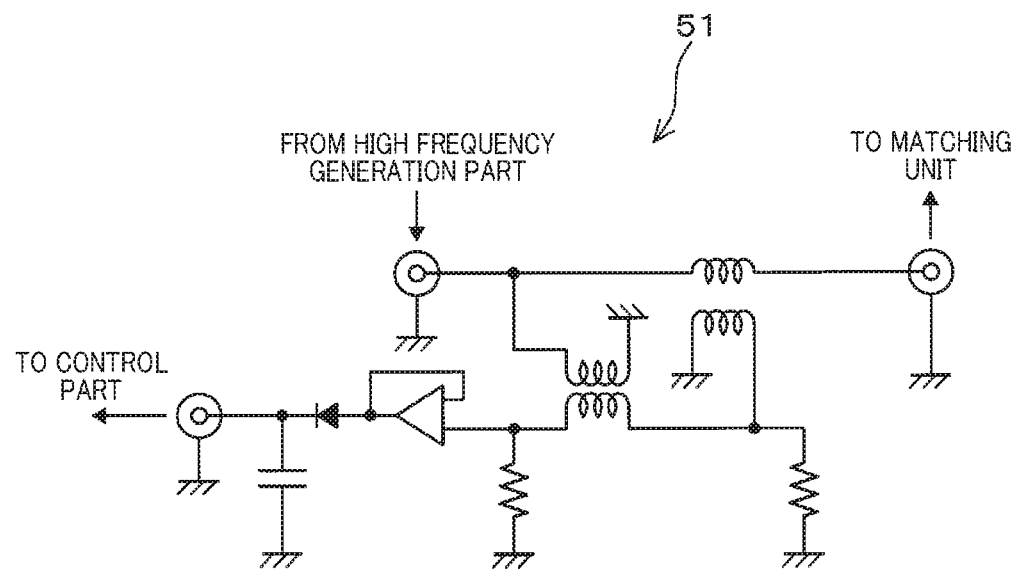
FIG. 11 is a view showing a schematic circuit structure of a detection circuit in a control unit in a wireless power supply device using the high frequency oscillator according to the exemplary embodiment of the present invention shown in FIG. 1.

FIG. 11 is a view showing a schematic circuit structure of the detection circuit 51 in the control unit 53 in the wireless power supply device 30 using the high frequency oscillator 10 according to the exemplary embodiment of the present invention shown in FIG. 1.

As shown in FIG. 8, the detection circuit 51 is arranged between the high frequency generation part 11 and the matching unit 13.

For example, the detection circuit 51 has a circuit shown in FIG. 11. The detection circuit 51 detects whether the high frequency power supplied from the high frequency generation part 11 is matched with the high frequency power in the power supply electrode member as the oscillation part 12. Specifically, the detection circuit 51 detects the matched state between the high frequency generation part 11 and the pair of power receiving electrode members 33 in the conveyor system 31 on the basis of the output of reflection wave (hereinafter, referred to as the matching output) transmitted from the oscillation part 12 which varies on the basis of the number of the power receiving electrode members 33, i.e. the number of the moving bodies 32.

Figure 12:
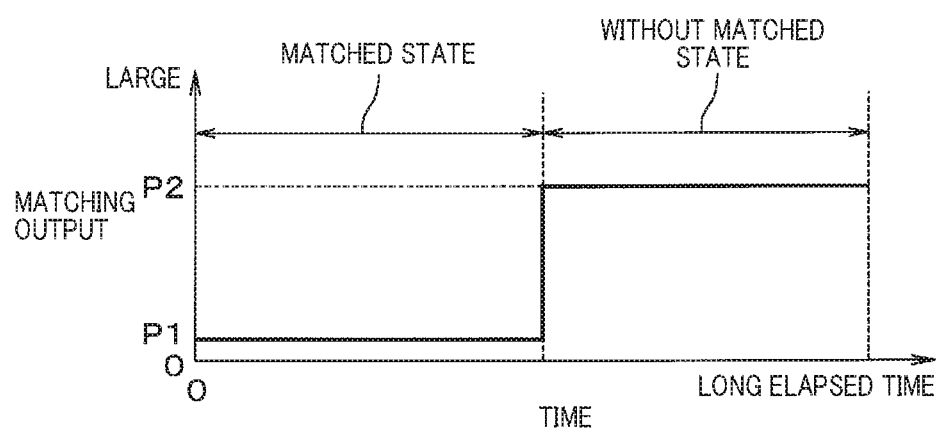
FIG. 12 is a view schematically explaining a relationship between a matching output and a matched state between a high frequency generation part and an oscillation part in the wireless power supply device using the high frequency oscillator according to the exemplary embodiment of the present invention shown in FIG. 1.

FIG. 12 is a view schematically explaining a relationship between the matching output and the matched state between the high frequency generation part 10 and the oscillation part 12 in the wireless power supply device 30 using the high frequency oscillator 10 according to the exemplary embodiment of the present invention shown in FIG. 1.

As shown in FIG. 12, the matching output varies on the basis of the matched state between the high frequency generation part 11 and the oscillation part 12. That is, when the high frequency generation part 11 is matched with the oscillation part 12, the matching output becomes a low output power P1. On the other hand, when the high frequency generation part 11 is not matched with the oscillation part 12, the matching output becomes a high output power P2 which is greater than the low output power P1.

For example, when the number of the moving bodies 32 receiving the electric power supplied from the oscillation part 12 is matched with the impedance of the matching circuits 14 in the matching unit 13, the matching output becomes the low output power P1. The detection circuit 51 in the control unit 53 in the wireless power supply device 30 detects either the low output power P1 or the high output power P2 so as to detect whether the matched state between the impedance of the matching circuits 14 in the matching unit 13 and the number of the moving bodies 13 occurs. In the control unit 53 in the wireless power supply device 30, the detection circuit 51 transmits the detection result to the control part 52 shown in FIG. 8.

The control part 52 is composed of a microcomputer having a central processing unit (CPU), a read only memory (ROM), a random access memory (RAM), etc. The control part 52 executes programs stored in the ROM so as to control the behavior of the matching unit 13. It is acceptable to use software programs and hardware circuits to form the matching unit 13. The control part 52 turns on/off the switch part 16 in each of the matching circuits 14 in the matching unit 13 on the basis of the matching output detected by the detection circuit 51 in the control unit 53. That is, the control part 52 generates a control signal on the basis of the matching output, and transmits the generated control signal to the gate terminal 19 of each switch part 16 so as to turn on and off the switch part 16. The control part 52 further turns on and off each matching circuit 14 in the matching unit 13 so as to adjust the impedance between the high frequency generation part 11 and the oscillation part 12 on the basis of the number of the moving bodies 32.

As previously described, each of the high frequency oscillator 10, the wireless power supply device 30 and the conveyor system 31 according to the exemplary embodiment has the improved structure and features. That is, in the improved structure of the high frequency oscillator 10, the switch part 16 switches the corresponding capacitor 142 (see FIG. 2) in the corresponding matching circuit 14 in the matching unit 13 through the corresponding rectification element part 15. Each of the matching circuits 14 in the matching unit 13 has the corresponding rectification element part 15. The rectification element part 15 rectified the high frequency power supplied from the high frequency generation part 11 to the oscillation part 12. The switch part 16 switches the turned on state and the turned-off state of the capacitor 142 in the matching circuit 14 on the basis of the state of the rectification element part 15. In other words, the switch part 16 allows the current rectified in the rectification element part 15 to flow or prohibits the current rectified in the rectification element part 15 from flowing. When the switch part 16 prohibits the current rectified in the rectification element part 15 from flowing, the high frequency current is prohibited in the rectification element part 15 connected to the switch part 16 from flowing. As a result, it is not necessary for the switch part 16 to be turned on/off in synchronization with the current state of the high frequency current which flows in the matching circuit 14. That is, it is possible for the switch part 16 to switch the use of the capacitor 142 corresponding to the matching circuit 14 regardless of the frequency of the high frequency power. It is possible to switch the use of the capacitor 142 corresponding to each matching circuit 14 on the basis of the turning on/off of the corresponding switch part 16. It is necessary for each of the switch parts 16 to turn on/off the current rectified by the corresponding rectification element part 15. This makes it possible to use each of the switch parts 16 having a low function with a low cost, not expensive because of switching the characteristics of each of the matching circuits 14 on the basis of a low frequency or a direct current rather than the frequency of the high frequency power generated in the high frequency generation part 11.

Further, the switch part 16 switches the turned-on state and the turned-off state of the capacitor 142 used in the corresponding matching circuit 14 on the basis of the direct current or a low frequency. This makes it possible to avoid the use of expensive MOS FETs operating at a high frequency, and to use inexpensive transistors and elements operating at a low frequency. This makes it possible to allow the each of the high frequency oscillator 10, the wireless power supply device 30 and the conveyor system 31 to have a simple structure, and to reduce the manufacturing cost of them. In addition, each of the switch parts 16 turns on and off a current rectified by the corresponding rectification element part 15. This makes it possible to avoid the matching unit 13 from directly turning on/off the high frequency power generated by the high frequency generation part 11 and to be supplied to the oscillation part 12. Accordingly, when the high frequency oscillator 10 is applied to the conveyor system 31 in which a large current flows in the moving bodies 32, it is possible to use the switch parts 16 of inexpensive cost capable of operating at a low frequency. This makes it possible to apply the high frequency oscillator 10 of a simple structure, without using any complicated and expensive structure in response to a large current, according to the exemplary embodiment to various systems using a large current.

As previously described, the exemplary embodiment shows the example in which the high frequency oscillator 10 is applied to the wireless power supply device 30 (see FIG. 8) to supply high frequency power to the moving bodies 32 in the conveyor system 31. However, the concept of the present invention is not limited by this exemplary embodiment. For example, it is possible to apply the high frequency oscillator 10 to various devices and apparatus, such as wireless communication devices capable of oscillating high frequency power, so as to match the high frequency generation part with the oscillation part.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A high frequency oscillator comprising:
   a high frequency generation part which generates high frequency power;
   an oscillation part which oscillates the high frequency power generated by the high frequency generation part;
   a matching unit arranged between the high frequency generation part and the oscillation part so as to match the high frequency generation part with the oscillation part, the matching unit comprising one or more matching circuits having different characteristics, one or more rectification element parts and switch parts, the matching circuits corresponding to the respective rectification element parts and switch parts in one to one correspondence, each of the matching circuits comprising a capacitor, the rectification element parts rectifying the high frequency power supplied from the high frequency generation part to the oscillation part, and the switch parts being connected to the respective rectification element parts, and each of the switching parts switching a state of the corresponding capacitor connected to the corresponding rectification element part.

2. The high frequency oscillator according to claim 1, wherein each of the switch parts comprises a switching element operating at a frequency which is lower than a frequency of the high frequency power generated by the high frequency generation part, and the switching element switches the state of the corresponding matching circuit comprising the capacitor.

3. The high frequency oscillator according to claim 1, wherein each of the switching parts has a switching element capable of turning on/off a direct current of the high frequency power rectified by the corresponding rectification element part.

4. The high frequency oscillator according to claim 1, wherein the matching circuits in the matching unit have a different impedance.

5. The high frequency oscillator according to claim 2, wherein the matching circuits in the matching unit have a different impedance.

6. The high frequency oscillator according to claim 3, wherein the matching circuits in the matching unit have a different impedance.

7. A wireless power supply device capable of performing wireless power supply based on electric field coupling using electrostatic capacitance between a power supply electrode member and a power receiving electrode members, comprising:
   the high frequency oscillator according to claim 1, the high frequency oscillator comprising the high frequency generation part, the oscillation part and the matching unit;
   a detection circuit which detects occurrence of a matched state between a high frequency power supplied from the high frequency generation part and a high frequency power oscillated from the power supply electrode member as the oscillation part;
   the power receiving electrode members which receive high frequency power from the power supply electrode member as the oscillation part; and
   a control part instructs the matching unit to switch the matching circuits in the matching unit on the basis of a detection result regarding the occurrence of the matched state transmitted from the detection circuit.

8. A wireless power supply device capable of performing wireless power supply based on electric field coupling using electrostatic capacitance between a power supply electrode member and a power receiving electrode members, comprising:
   the high frequency oscillator according to claim 2, the high frequency oscillator comprising the high frequency generation part, the oscillation part and the matching unit;
   a detection circuit which detects occurrence of a matched state between a high frequency power supplied from the high frequency generation part and a high frequency power supplied from the power supply electrode member as the oscillation part;
   the power receiving electrode members which receive high frequency power from the power supply electrode member as the oscillation part; and
   a control part instructs the matching unit to switch the matching circuits in the matching unit on the basis of a detection result regarding the occurrence of the matched state transmitted from the detection circuit.

9. A wireless power supply device capable of performing wireless power supply based on electric field coupling using electrostatic capacitance between a power supply electrode member and a power receiving electrode members, comprising:
   the high frequency oscillator according to claim 3, the high frequency oscillator comprising the high frequency generation part, the oscillation part and the matching unit;
   a detection circuit which detects occurrence of a matched state between a high frequency power supplied from the high frequency generation part and a high frequency power oscillated from the power supply electrode member as the oscillation part;
   the power receiving electrode members which receive high frequency power from the power supply electrode member as the oscillation part; and
   a control part instructs the matching unit to switch the matching circuits in the matching unit on the basis of a detection result regarding the occurrence of the matched state transmitted from the detection circuit.

* * * * *